(12) United States Patent
Bai

(10) Patent No.: US 12,302,490 B2
(45) Date of Patent: May 13, 2025

(54) SIGNAL TRANSMISSION STRUCTURE, ELECTRONIC DEVICE, AND PCB

(71) Applicant: Honor Device Co., Ltd., Shenzhen (CN)

(72) Inventor: Puwei Bai, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/041,768

(22) PCT Filed: Aug. 25, 2022

(86) PCT No.: PCT/CN2022/114833
§ 371 (c)(1),
(2) Date: Feb. 15, 2023

(87) PCT Pub. No.: WO2023/098172
PCT Pub. Date: Jun. 8, 2023

(65) Prior Publication Data
US 2024/0130036 A1 Apr. 18, 2024

(30) Foreign Application Priority Data
Nov. 30, 2021 (CN) .......................... 202111442282.7

(51) Int. Cl.
H05K 1/02 (2006.01)
(52) U.S. Cl.
CPC .................................. H05K 1/0224 (2013.01)

(58) Field of Classification Search
None
See application file for complete search history.

(56) References Cited

U.S. PATENT DOCUMENTS 7,443,691 B1 * 10/2008 Davis ................... H05K 5/0278
361/752
7,642,878 B2 * 1/2010 Park .......................... H01P 3/08
333/1

(Continued)

FOREIGN PATENT DOCUMENTS

| CN | 101145554 A | 3/2008 |
|---|---|---|
| CN | 102264188 A | 11/2011 |

(Continued)

*Primary Examiner* — Krystal Robinson
(74) *Attorney, Agent, or Firm* — Conley Rose, P.C.

(57) ABSTRACT

A signal transmission structure, an electronic device, and a PCB. The signal transmission structure includes a reference ground layer and a signal layer disposed above the reference ground layer. The signal layer includes a plurality of signal transmission lines are disposed in parallel along a line width direction having gaps therebetween. The reference ground layer includes a first reference area, and the first reference area is an orthographic projection area, at the reference ground layer, of two of the plurality of signal transmission lines and a gap between the two signal transmission lines. The first reference area is provided with a plurality of notches, and the plurality of notches is located on an orthographic projection, in the first reference area, of the two signal transmission lines, and the notches are distributed in an array at intervals along a line length direction of the signal transmission lines.

20 Claims, 10 Drawing Sheets

(56) References Cited

U.S. PATENT DOCUMENTS

| | | | |
|---|---|---|---|
| 7,708,564 B2 * | 5/2010 | Fogg | ................... H05K 1/0231 439/65 |
| 2002/0040807 A1 | 4/2002 | Doberenz | |
| 2014/0049343 A1 | 2/2014 | Sakai | |
| 2015/0318595 A1 | 11/2015 | Yosui et al. | |
| 2016/0087323 A1 | 3/2016 | Wu et al. | |
| 2016/0307853 A1 | 10/2016 | Fukuchi et al. | |

FOREIGN PATENT DOCUMENTS

| | | |
|---|---|---|
| CN | 105873356 A | 8/2016 |
| CN | 208581395 U | 3/2019 |
| CN | 110324960 A | 10/2019 |
| CN | 211297148 U | 8/2020 |
| CN | 113709961 A | 11/2021 |
| JP | 2007150000 A | 6/2007 |
| WO | 2013190859 A1 | 12/2013 |

* cited by examiner

SIGNAL TRANSMISSION STRUCTURE, ELECTRONIC DEVICE, AND PCB

CROSS-REFERENCE TO RELATED APPLICATIONS

This application is a U.S. National Stage of International Application No. PCT/CN2022/114833 filed on Aug. 25, 2022, which claims priority to Chinese Patent Application No. 202111442282.7, filed on Nov. 30, 2021, both of which are incorporated herein by reference in their entireties.

TECHNICAL FIELD

This application relates to the field of electronic component technologies, and in particular, to a signal transmission structure, an electronic device, and a PCB.

BACKGROUND

In a high speed and radio frequency circuit, resistance, inductance, and capacitance of transmission lines will impede signal propagation, which is referred to as impedance. A signal from a driving element in the radio frequency circuit is transmitted to a receiving element through signal transmission lines in a signal transmission structure to implement communication transmission. The impeding effect of a signal transmission line on current is referred to as characteristic impedance of the signal transmission line. The characteristic impedance is an inherent characteristic of the signal transmission line, and magnitude of the characteristic impedance is associated with factors such as a dielectric constant of the signal transmission line, a distance between the signal and a reference plane, a width of a signal line, and a copper thickness. In a high speed and high frequency signal transmission scenario, the magnitude of characteristic impedance affects signal transmission quality. For example, if the characteristic impedance is too low to match impedance of a transmitting end and a receiving end, signal reflection is increased, and consequently, a signal transmission return loss is increased, and the signal transmission quality is reduced.

Due to the limitations of board-making processes and dielectric materials, the characteristic impedance of signal transmission lines is low in some scenarios (for example, a thin PCB lamination scenario), and consequently, it is difficult for the signal transmission lines to meet signal transmission requirements. Currently, when the characteristic impedance of signal transmission lines is too low, the characteristic impedance may be increased by using a low-Dk material or increasing the distance between the signal line and a reference plane, so as to implement impedance control. For example, a signal transmission structure includes a signal layer, a first dielectric layer, a first reference layer, a second dielectric layer, and a second reference layer from top to bottom. The signal layer is provided with signal transmission lines. The first reference layer is provided with a hollowed-out area, and the hollowed-out area is located in a vertical projection area, at the first reference layer, of the signal transmission lines. The hollowed-out area may increase the distance between a signal and a reference layer from a first distance between the signal and the first reference layer to a second distance between the signal and the second reference layer, so as to reduce the capacitance per unit length of the signal transmission lines, and increase the characteristic impedance. However, the current impedance control scheme will increase a design area of the signal transmission structure, which reduces space utilization and inhibits performance of electronic devices.

SUMMARY

This application provides a signal transmission structure, an electronic device, and a PCB. The transmission structure is designed to reduce a coupling area per unit length to increase characteristic impedance, so as to implement optimal impedance control, so that the signal transmission structure has the advantages of low material costs and high space utilization.

According to a first aspect, this application provides a signal transmission structure, including: a reference ground layer and a signal layer disposed above the reference ground layer. The signal layer is provided with a plurality of signal transmission lines, and the plurality of signal transmission lines are disposed in parallel along a line width direction, and there is a gap between every two signal transmission lines. The reference ground layer is provided with a first reference area, and the first reference area is an orthographic projection area of two of the plurality of signal transmission lines and a gap between the two signal transmission lines. The first reference area is provided with a plurality of notches, and the plurality of notches are located on an orthographic projection, in the first reference area, of the two signal transmission lines, and are distributed in an array at intervals along a line length direction of the signal transmission lines. Spacing grooves are disposed on two sides of the first reference area, and the spacing grooves are continuously distributed along the line length direction of the signal transmission lines.

In the signal transmission structure provided in this application, an edge coupling area per unit length and capacitance per unit length are reduced by disposing the spacing grooves on two sides of the orthographic projection area, at the reference ground layer, of the two signal transmission lines, and disposing the plurality of notches in the orthographic projection area, at the reference ground layer, of the two signal transmission lines, so that characteristic impedance is increased to implement optimal impedance control. The signal transmission structure has the advantages of low material costs and high space utilization. In a specific implementation scenario, the signal transmission structure provided in this application may be implemented based on an ultra-thin PCB structure scenario, to meet transmission performance of high speed signals while optimizing the thickness of a PCB structure, so as to improve user experience.

In an optional implementation, the reference ground layer further includes two second reference areas, and the two second reference areas are distributed on the two sides of the first reference area along the line width direction of the signal transmission lines; and a spacing groove is located between each of the second reference areas and the first reference area.

The width of each spacing groove needs to be greater than 0.1 mm. Therefore, an avoidance space is disposed at the reference ground layer by disposing the spacing grooves on the two sides of the first reference area. When the signal layer is provided with a plurality of signal transmission lines, signal transmission performance is guaranteed by disposing the avoidance space at the reference ground layer.

In an optional implementation, the plurality of notches located on an orthographic projection, in the first reference area, of one of the signal transmission lines and the plurality of notches located on an orthographic projection, in the first reference area, of another one of the signal transmission lines are symmetrically disposed along an axial direction of the first reference area.

In an optional implementation, the width of each notch in the line width direction of the signal transmission lines is equal to the width of the signal transmission lines.

In an optional implementation, the notches have the same length in the line length direction of the signal transmission lines.

In an optional implementation, the notches are rectangular notches.

In an optional implementation, the notches are triangular notches.

In an optional implementation, the notches are trapezoidal notches.

Therefore, notch shapes provided in this application include, but are not limited to, the foregoing shapes, and may be any shape such as polygon, and notch areas corresponding to the notches need to be consistent, so as to prevent common mode interference during transmission of the signal transmission lines and ensure signal transmission performance.

In an optional implementation, the length of the notches in the line length direction of the signal transmission lines meets the following formula:

$$L < \frac{\lambda}{8};$$

where L is the length of the notches in the line length direction of the signal transmission lines, and $\lambda$ is a wavelength corresponding to a maximum frequency of a signal.

In an optional implementation, the two spacing grooves have the same width.

In an optional implementation, the signal transmission structure further includes a dielectric layer, where the dielectric layer is disposed between the signal layer and the reference ground layer.

According to a second aspect, this application provides an electronic device, including the signal transmission structure according to the first aspect, where the signal transmission structure is disposed inside the electronic device. During communication of the electronic device, the internal signal transmission structure reduces a coupling area per unit length to increase characteristic impedance, by providing a plurality of notches and spacing grooves at the reference ground layer, so as to implement optimal impedance control.

According to a third aspect, this application provides a PCB, including the signal transmission structure according to the first aspect, where the signal transmission structure is disposed inside the PCB. The signal transmission structure provided in this application optimizes the thickness of a PCB structure while meeting the transmission performance of high speed signals, and improves user experience without limitation to usage scenarios. The signal transmission structure may be used in an ultra-thin single-layer PCB structure, and may also be used in a laminated structure of a multi-layer PCB structure. Specific usage scenarios of the signal transmission structure are not limited, and the signal transmission structure may or may not be disposed at a buried layer.

It can be learned from the foregoing technical solutions that this application provides a signal transmission structure, an electronic device, and a PCB. The signal transmission structure includes a reference ground layer and a signal layer disposed above the reference ground layer. The signal layer includes a plurality of signal transmission lines, and the plurality of signal transmission lines are disposed in parallel along a line width direction and have gaps. The reference ground layer includes a first reference area and two second reference areas, and the first reference area is an orthographic projection area, at the reference ground layer, of two of the plurality of signal transmission lines and a gap between the two signal transmission lines. The first reference area is provided with a plurality of notches, and the plurality of notches are located on an orthographic projection, in the first reference area, of the two signal transmission lines, and are distributed in an array at intervals along a line length direction of the signal transmission lines. The two second reference areas are distributed on the two sides of the first reference area along the line width direction of the signal transmission lines. A spacing groove is disposed between each of the second reference areas and the first reference area. The transmission structure is designed to reduce a coupling area per unit length to increase characteristic impedance, so as to implement optimal impedance control. The signal transmission structure has the advantages of low material costs and high space utilization.

DESCRIPTION OF EMBODIMENTS

Figure 1:
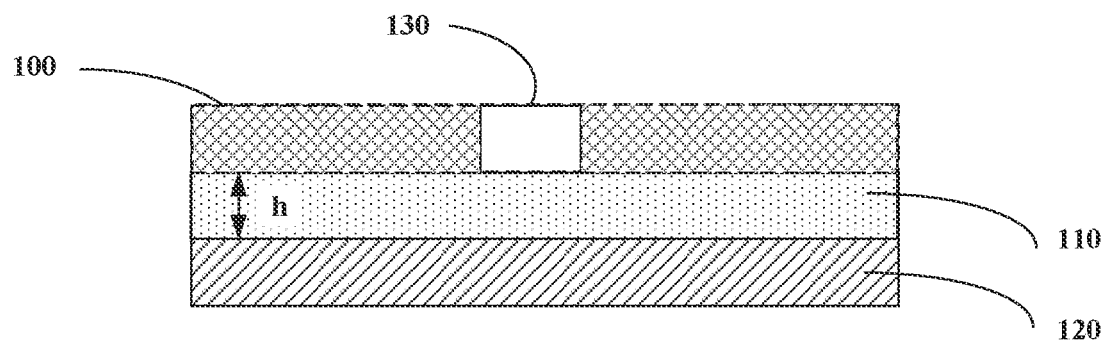
FIG. 1 is a sectional view of an example of a typical microstrip line transmission structure.

Technical solutions in embodiments of this application will be clearly described with reference to accompanying drawings in embodiments of this application. Apparently, the described embodiments are merely some rather than all of the embodiments of this application. All other embodiments obtained by a person of ordinary skill in the art based on embodiments of this application without creative efforts shall fall within the protection scope of this application.

Terms used in the following embodiments are merely intended for the purpose of describing specific embodiments, but not intended to limit this application. As used in the specification and the appended claims of this application, the terms "one", "a/an", "said". "the", and "this" of singular forms are also intended to include, for example, the form of "one or more", unless otherwise specified in the context clearly. It should be further understood that in the following embodiments of this application, "at least one" and "one or more" mean one, two, or more than two. The term "and/or" is used to describe an association relationship between associated objects, and indicates that three relationships may exist. For example, A and/or B may represent the following three cases: Only A exists, both A and B exist, and only B exists. A and B may be singular or plural. The symbol "/" usually indicates an "or" relationship between the associated objects.

Signal transmission structures shown in the embodiments of this application may be applied to electronic devices, including but not limited to mobile or fixed terminals with PCB structures, such as mobile phones, tablet computers, laptops, ultra-mobile personal computers (ultra-mobile personal computers, UMPCs), handheld computers, walkie-talkies, netbooks, POS machines, wearable devices, virtual reality devices, wireless USB flash drives, Bluetooth sounders, Bluetooth headsets, or factory-installed vehicle components. This is not limited in the embodiments of this application.

A printed circuit board (Printed Circuit Board, PCB) uses a board-based insulating material to isolate a conductive layer of copper foil on the surface, so that current flows in various components along a pre-designed route, so as to implement functions such as doing work, amplification, attenuation, modulation, demodulation, and coding. In an essential PCB signal transmission structure, the entire board is divided into two sides, with parts concentrated on one side and wires concentrated on the other side. Because the wires are concentrated on only one side, the PCB signal transmission structure is referred to as a double-sided board. In addition, the PCB signal transmission structure also includes the design of a multi-layer board. In the design of a multi-layer board structure, wires are provided at a plurality of layers, and an appropriate circuit connection needs to be provided between two layers where the wires are located.

The multi-layer board may include, based on materials, a plurality of signal layers, a reference layer, a power supply layer, and a dielectric layer. The signal layers are PCB layers where signal transmission lines are located. In the design of a PCB signal transmission structure, signal transmission lines are usually presented in the form of a differential pair P and N. Generally, the wiring environment of P and N should be as consistent as possible during the design, including consistency of line width spacing, and matching of wiring length; and relative dielectric constants around P and N should also be consistent. The reference layer is a PCB layer used for grounding; the power supply layer is a PCB layer used for power supply; and the dielectric layer is also an insulating layer located between the signal layer, the reference layer, and the power supply layer.

FIG. 1 is a cross-sectional view of an example of a typical microstrip line transmission structure. The typical microstrip line transmission structure includes a signal layer 100, a reference layer 120, and a dielectric layer 110. The signal layer 100 is provided with signal transmission lines 130; and a dielectric layer 110 with a thickness of h is disposed between the signal layer 100 and the reference layer 120.

Figure 2:
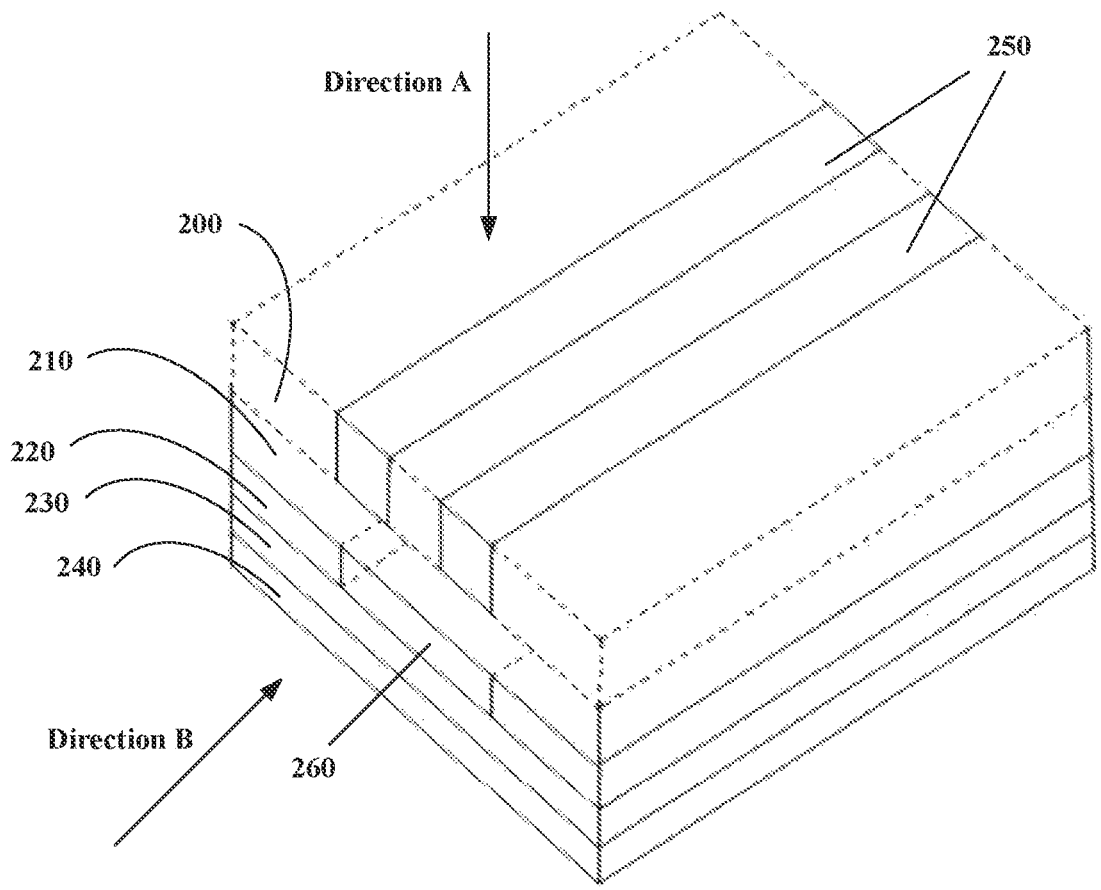
FIG. 2 is a schematic diagram of an example of a typical differential signal transmission structure.

Due to the limitations of board-making processes and dielectric materials, the characteristic impedance of signal transmission lines is low in some scenarios (for example, ultra-thin multi-layer PCB scenarios), and consequently, it is difficult for the signal transmission lines to meet signal transmission requirements. Currently, when the characteristic impedance of signal transmission lines is too low, the characteristic impedance may be increased by using a low-Dk material or increasing the distance between the signal line and a reference plane, so as to implement impedance control. FIG. 2 is a schematic diagram of an example of a typical differential signal transmission structure. Referring to FIG. 2, the typical differential signal transmission structure is a laminated structure, and the typical differential signal transmission structure includes a signal layer 200, a first dielectric layer 210, a first reference layer 220, a second dielectric layer 230, and a second reference layer 240 from top to bottom. The signal layer 200 is provided with a pad area; and the pad area includes a plurality of pads for electrical connection with the outside, and each pad is connected to a corresponding signal transmission line 250, such as a differential pair P and N, to transmit electrical signals. The first reference layer 220 is provided with a hollowed-out area 260, and the hollowed-out area 260 is located in a vertical projection area, at the first reference layer 220, of the signal transmission lines 250.

Generally, when high speed and high frequency signals are transmitted over the signal transmission lines, impedance control is required for signal transmission paths in the signal transmission structure to reduce reflection. Factors that affect characteristic impedance of the signal transmission line in the signal transmission structure mainly include the distance between a signal and a reference plane, a width of the signal transmission line, a thickness of the signal transmission line, a dielectric constant of a medium, a thickness of the medium, and a thickness of a pad.

Figure 3:
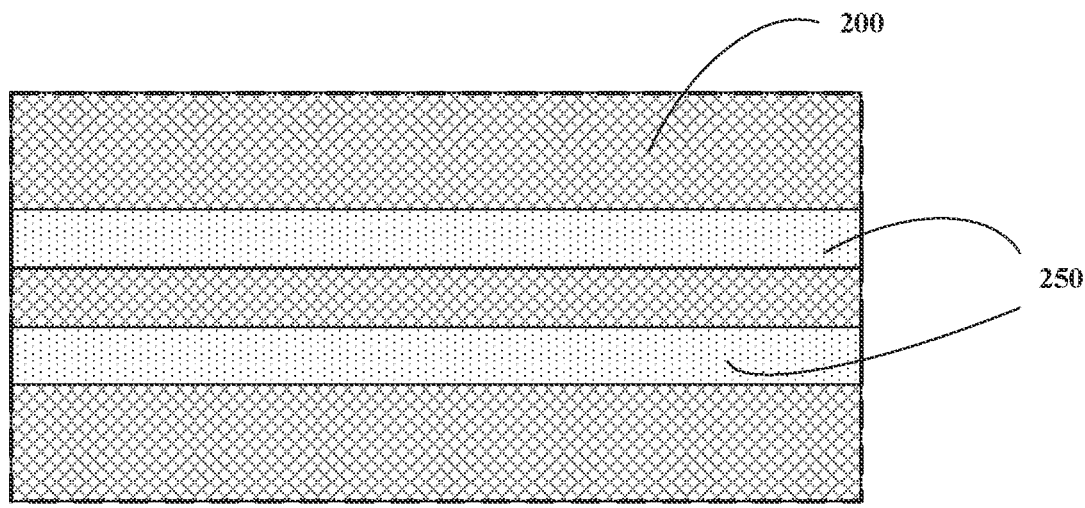
FIG. 3 is a direction-A schematic diagram of an example of a typical differential signal transmission structure.
Figure 4:
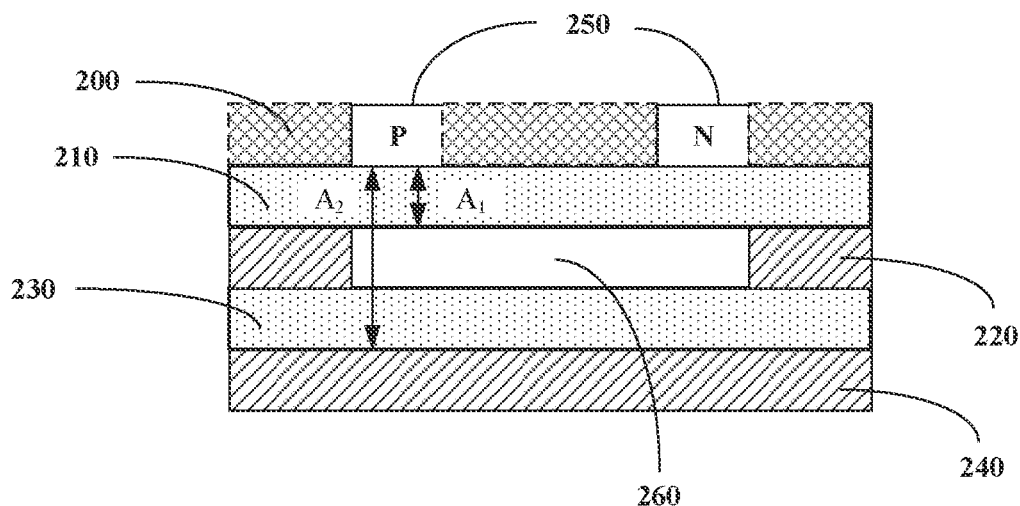
FIG. 4 is a direction-B schematic diagram of an example of a typical differential signal transmission structure.

FIG. 3 is a direction-A schematic diagram of an example of the typical differential signal transmission structure in FIG. 2. Referring to FIG. 3, the signal layer 200 includes two signal transmission lines 250. The two signal transmission lines 250 are disposed in parallel, and there is a gap between the two signal transmission lines 250. FIG. 4 is a direction-B schematic diagram of an example of the typical differential signal transmission structure in FIG. 2. Referring to FIG. 4, the first reference layer 220 is provided with a hollowed-out area 260, and the hollowed-out area 260 is located in a vertical projection area, at the first reference layer 220, of the signal transmission lines 250. The hollowed-out area 260 may increase the distance between a signal and a reference layer from a first distance A1 between the signal and the first reference layer 220 to a second distance A2 between the signal and the second reference layer 240, so as to reduce the capacitance per unit length of the signal transmission lines, and increase the characteristic impedance. However, the hollowed-out area 260 increases an internal design area of the signal transmission structure while increasing the characteristic impedance and improving signal transmission quality, so as to reduce the internal space utilization of the signal transmission structure. It should be noted that the foregoing typical signal transmission structure is not limited to including the signal layer 200, the first dielectric layer 210, the first reference layer 220, the second dielectric layer 230, and the second reference layer 240, and these layers may be arranged and combined based on an actual situation. Only two reference layers are used as an example in this embodiment, and this embodiment is not limited to the foregoing implementations in practice.

Therefore, to optimize the typical differential signal transmission structure provided in the foregoing embodiment, this application provides a signal transmission structure. The signal transmission structure provided in this application may be implemented based on an ultra-thin PCB structure scenario, to meet transmission performance of high speed signals while optimizing the thickness of a PCB structure, so as to improve user experience. It should be noted that the signal transmission structure provided in this application may be used in an ultra-thin single-layer board structure, and may also be used in a laminated structure of a multi-layer board. Specific usage scenarios of the signal transmission structure are not limited, and the signal transmission structure may or may not be disposed in a buried layer.

Figure 5:
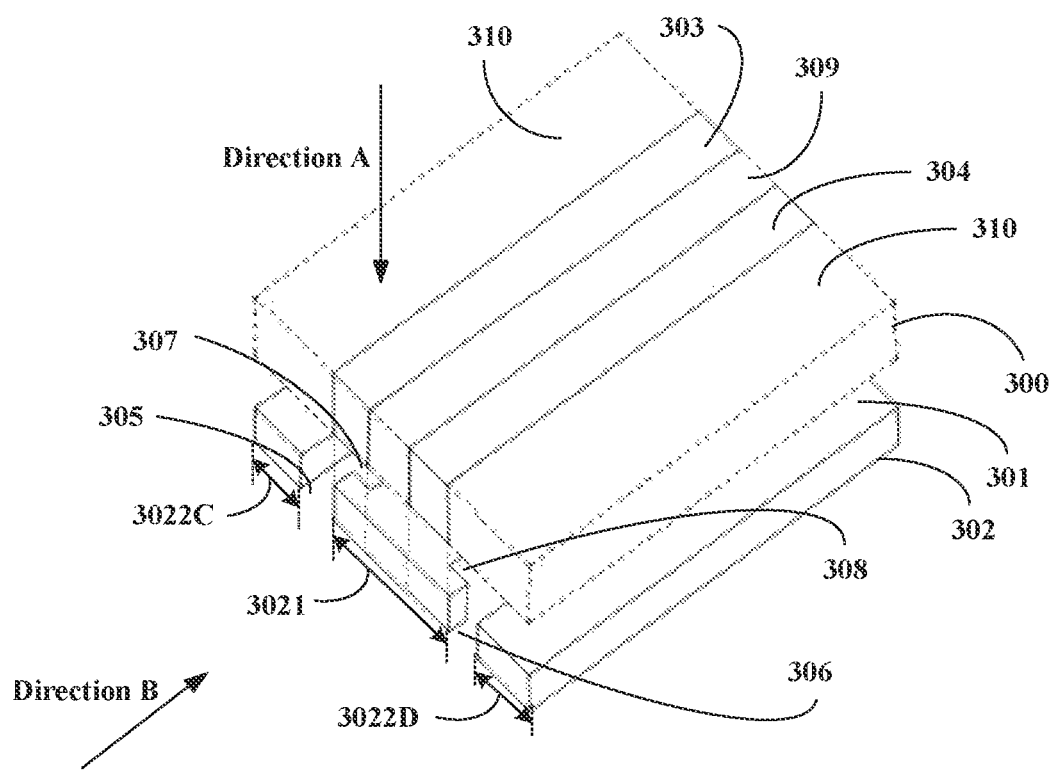
FIG. 5 is a schematic diagram of an example of a signal transmission structure according to this application.

FIG. 5 is a schematic diagram of an example of a signal transmission structure according to this application. Referring to FIG. 5, the signal transmission structure includes a signal layer 300, a dielectric layer 301, and a reference ground layer 302. The signal layer 300 is disposed above the reference ground layer 302, and the dielectric layer 301 is disposed between the signal layer 300 and the reference ground layer 302. The signal layer 300 includes a plurality of signal transmission lines, the plurality of signal transmission lines are disposed in parallel along a line width direction and have gaps. For the convenience of subsequent description, two of the plurality of signal transmission lines are illustrated here, and the two signal transmission lines are respectively referred to as a first signal transmission line 303 and a second signal transmission line 304. The first signal transmission line 303 and the second signal transmission line 304 are a pair of differential lines, where the first signal transmission line 303 is a signal transmission line P, and the second signal transmission line 304 is a signal transmission line N, so as to distinguish the signal transmission lines to identify differential signals. The first signal transmission line 303 and the second signal transmission line 304 are disposed in parallel with a gap 309 therebetween. The first signal transmission line 303 and the second signal transmission line 304 are used to transmit differential signals with the same amplitude and opposite phases. A signal receiving end determines a logic state transmitted by a transmitting end by comparing voltage difference between the two signals, so as to implement high speed signal transmission. It should be noted that the two signal transmission lines provided in this application have the same height as the signal layer 300. In addition, because some areas of the PCB need to be copper-coated to reduce electromagnetic radiation interference, the two signal transmission lines provided in this application and other copper-coated areas at the same layer have an avoidance space 310, and the avoidance space has a width of 0.1 mm.

Further, as shown in FIG. 5, the reference ground layer 302 includes a first reference area 3021 and two second reference areas 3022. The first reference area 3021 is a vertical orthographic projection area, at the reference ground layer 302, of the first signal transmission line 303, the gap 309 and the second signal transmission line 304. The two second reference areas are distributed on two sides of the first reference area 3021 along the line width direction of the signal transmission lines. Spacing grooves are disposed on the two sides of the first reference area, a spacing groove is located between each of the second reference areas 3022 and the first reference area 3021, and the spacing grooves are continuously distributed along the line length direction of the signal transmission lines. To further describe positions of the two second reference areas 3022, the two second reference areas 3022 are referred to as an area C 3022C and an area D 3022D, respectively, where the area C 3022C is a vertical orthographic projection area, at the reference ground layer 302, of an outer side (that is, the side away from the second signal transmission line 304) of the first signal transmission line 303. The area D 3022D is a vertical orthographic projection area, at the reference ground layer 302, of an outer side (that is, the side away from the first signal transmission line 303) of the second signal transmission line 304. The area C 3022C is close to the first signal transmission line 303 and away from the second signal transmission line 304. The area D 3022D is close to the second signal transmission line 304 and away from the first signal transmission line 303. A first spacing groove 305 is disposed between the area C 3022C and the first reference area 3021, and a second spacing groove 306 is disposed between the area D 3022D and the first reference area 3021. The first spacing groove 305 and the second spacing groove 306 are continuously distributed along the line length direction of the signal transmission lines. The width of each spacing groove needs to be greater than 0.1 mm. The purpose of disposing each spacing groove is to provide an avoidance space at the reference ground layer. It should be noted that the signal layer may be provided with a plurality of signal transmission lines, and a spacing groove corresponding to other signal transmission lines may be disposed on one side, away from the first spacing groove 305, of the area C 3022C, where a width of the area C 3022C is not limited, and may be set based on an actual situation.

Further, a plurality of notches are disposed on the two sides of the first reference area 3021. For convenience of description, the plurality of notches located on an orthographic projection, in the first reference area, of the first signal transmission line 303 are referred to as first notches 307, and the plurality of notches located on an orthographic projection, in the first reference area, of the second signal transmission line 304 are referred to as second notches 308. The plurality of first notches 307 and the plurality of second notches 308 are distributed in an array at intervals along the line length direction of the signal transmission lines.

Figure 6:
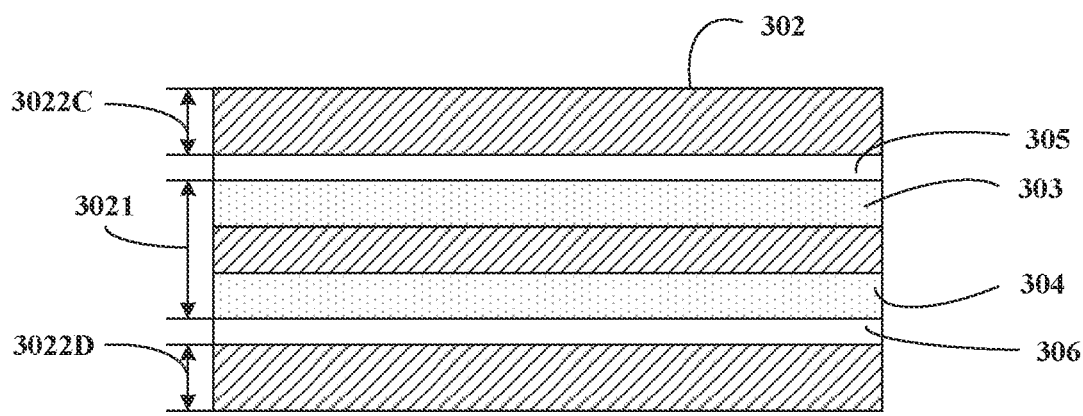
FIG. 6 is a direction-A schematic diagram of an example of a signal transmission structure according to this application.
Figure 9:
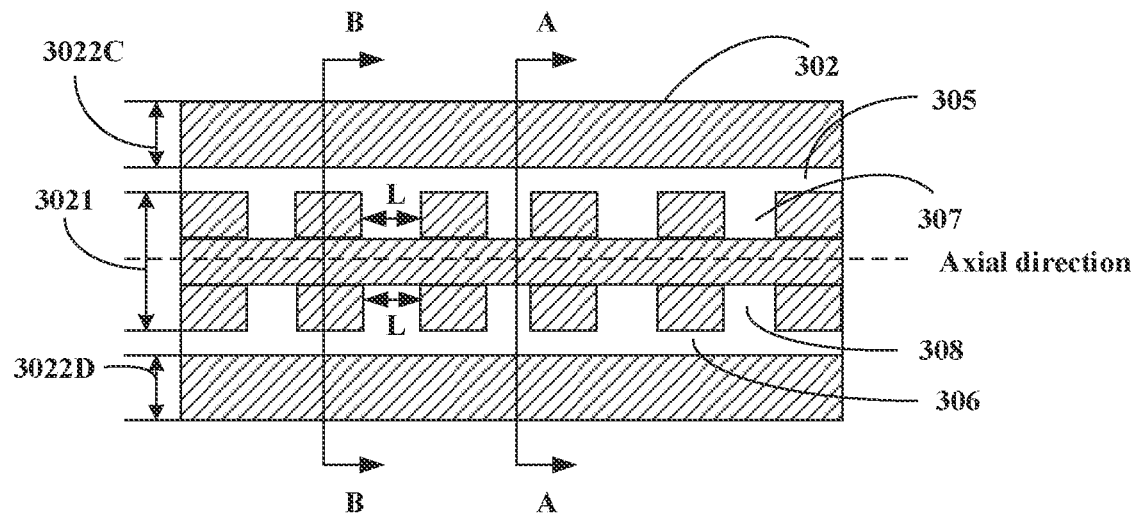
FIG. 9 is a direction-A schematic diagram of an example of a signal transmission structure according to this application.

FIG. 9 is a direction-A schematic diagram of an example of a signal transmission structure according to this application. Referring to FIG. 6, the first spacing groove 305 and the second spacing groove 306 are disposed on the two sides of the first reference area 3021 in parallel, the first spacing groove 305 is close to the area C 3022C, and the second spacing groove 306 is close to the area D 3022D.

Figure 7:
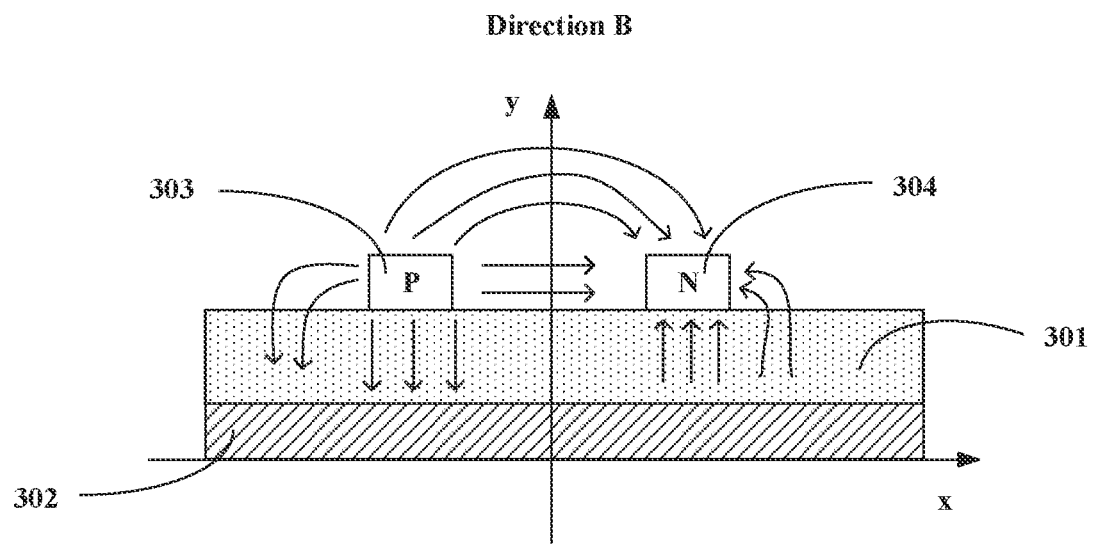
FIG. 7 is a diagram showing an example of electric field distribution of a signal transmission structure without grooves and notches.

FIG. 7 is a diagram showing an example of electric field distribution of a signal transmission structure without spacing grooves and notches. Referring to FIG. 7, the dielectric layer 301 is disposed between the reference ground layer 302 and the signal layer 300, and the dielectric layer 301 is an insulating layer used to maintain insulation between the transmission lines and the layers. A dielectric material is evenly distributed at the dielectric layer 301. In this embodiment of this application, for example, signals transmitted by a differential pair in a microstrip line are decomposed into differential signals (odd mode). For odd symmetry on a symmetry plane with x=0, there are electric fields around the two signal transmission lines, and one of the electric fields transmitted over the two signal transmission lines is positive and the other is negative along a y-axis direction. The propagation speed of signals along a transmission line is usually determined by an effective dielectric constant of a medium through which a power line passes. A larger effective dielectric constant indicates a lower propagation speed.

Figure 8:
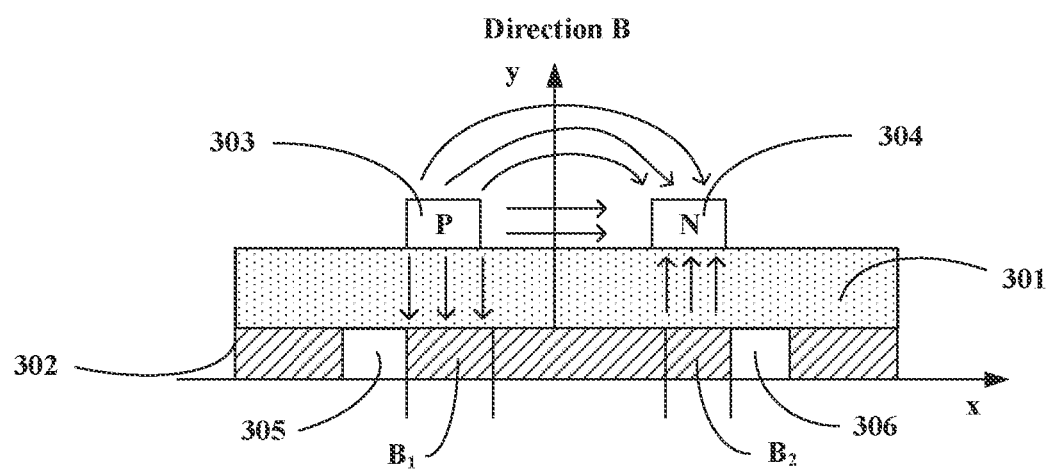
FIG. 8 is a diagram showing an example of electric field distribution of a signal transmission structure according to this application.

FIG. 8 is a diagram showing an example of electric field distribution of a signal transmission structure according to this application. Referring to FIG. 8, the first spacing groove 305 and the second spacing groove 306 are disposed in parallel and have the same width. The first spacing groove 305 is disposed, close to the first signal transmission line 303, in a vertical orthographic projection area B1 at the reference ground layer 302, and one side of the first spacing groove 305 coincides with one side of the vertical orthographic projection area B1. The second spacing groove 306 is disposed, close to the second signal transmission line 304, in a vertical orthographic projection area B2 at the reference ground layer 302, and the second spacing groove 306 coincides with one side of the vertical orthographic projection area B2. It should be noted that the vertical orthographic projection area B1, the vertical orthographic projection area B2, and a vertical orthographic projection area, at the reference ground layer 302, of the gap 309 forms the first reference area 3021. Similarly, for example, signals transmitted by a differential pair in a microstrip line are decomposed into differential signals (odd mode). Electric field distribution of this signal transmission structure is odd symmetric on a symmetry plane with x=0, and one of the electric fields transmitted over the first signal transmission line 303 and the second signal transmission line 304 is positive along a y-axis direction, and the other electric field is negative. The electric field distribution of this signal transmission structure is different from that of the foregoing signal transmission structure without grooves and notches. There is no electric field in a vertical orthographic projection direction, at the reference ground layer 302, outside the first signal transmission line 303; there is no electric field in a vertical orthographic projection direction, at the reference ground layer 302, outside the second signal transmission line 304; and electric fields only exist in the vertical orthogonal projection direction, at the reference ground layer 302, of the first signal transmission line 303, in the vertical orthogonal projection direction, at the reference ground layer 302, of the second signal transmission line 304, and between two transmission lines. The first spacing groove 305 and the second spacing groove 306 may be disposed to reduce an edge coupling area, so as to reduce the capacitance per unit length of the signal transmission lines, and increase the characteristic impedance.

FIG. 6 is a direction-A schematic diagram of an example of a signal transmission structure according to this application. A plurality of first notches 307 and a plurality of second notches 308 are distributed on the two sides of the first reference area 3021 at intervals along an axial direction of the first reference area 3021. The first notches 307 and the second notches 308 are rectangular notches, and the plurality of first notches 307 and the plurality of second notches 308 are symmetrically disposed along the axial direction of the first reference area 3021. The widths of the first notch 307 and the second notch 308 in the line width direction of the signal transmission lines are equal to the width of the signal transmission line. The first notches 307 and the second notches 308 have the same length L in the line length direction of the signal transmission lines, and the first notches 307 and the second notches 308 also have the same width and height.

Figure 10:
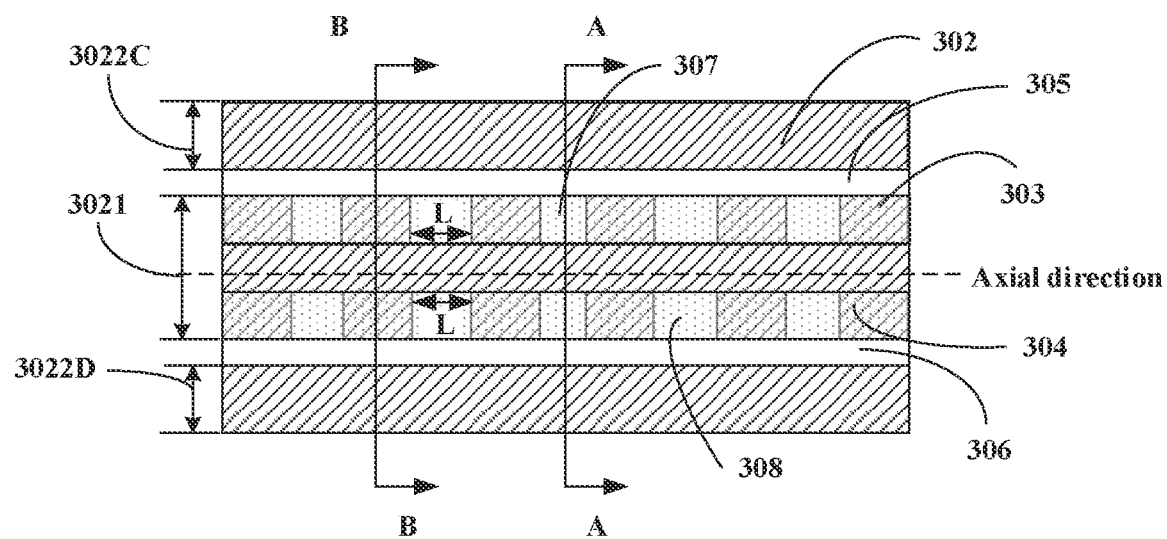
FIG. 10 is a direction-A schematic diagram of an example of a signal transmission structure according to this application.
Figure 11:
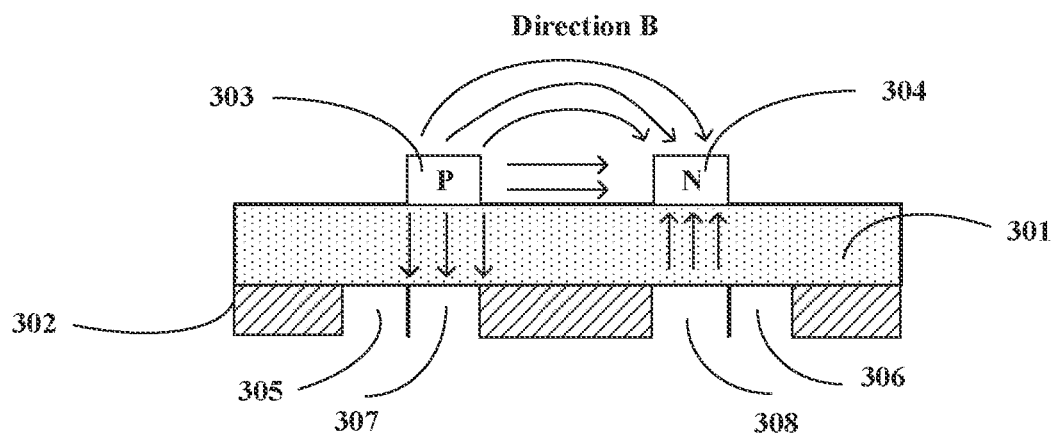
FIG. 11 is a diagram showing an example of electric field distribution of a signal transmission structure according to this application.

FIG. 10 is a direction-A schematic diagram of an example of a signal transmission structure according to this application. Referring to FIG. 10, the plurality of first notches 307 are disposed at intervals in the vertical orthographic projection area, at the reference ground layer 302, of the first signal transmission line 303. The notches have the same spacing, and the width of each first notch 307 is consistent with the width of the first signal transmission line 303. The plurality of second notches 308 are disposed at intervals in the vertical orthographic projection area, at the reference ground layer 302, of the second signal transmission line 304. The second notches 308 have the same spacing, and the width of each second notch 308 is consistent with the width of the second signal transmission line 304. Because the plurality of first notches 307 and the plurality of second notches 308 are distributed on the two sides of the first reference area 3021 at intervals along the axial direction of the first reference area 3021, two structures are formed along the direction A and the direction B in the figure. The first structure is an area where the first notches 307 and the second notches 308 are disposed in the first reference area 3021. Referring to FIG. 11, the vertical orthographic projection areas, at the reference ground layer 302, of the first signal transmission line 303 and the second signal transmission line 304 are notched without a reference ground, and the first spacing groove 305 and the second spacing groove 306 are hollowed out without a reference ground. The second structure is an area where the first notches 307 and the second notches 308 are not disposed in the first reference area 3021. Referring to FIG. 8, the first signal transmission line 303 and the second signal transmission line 304 are provided with a reference ground in the orthographic projection areas at the reference ground layer 302, and only the first spacing groove 305 and the second spacing groove 306 are hollowed out.

It should be noted that disposing of the first notches 307 and the second notches 308 is a preferred solution of this application. It should be noted that the spacing between each first notch 307 and each second notch 308 may be different, the width of the first notch 307 may be different from that of the first signal transmission line 303, and the width of the second notch 308 may also be different from that of the second signal transmission line 304. The plurality of first notches 307 and the plurality of second notches 308 may not be symmetrically disposed along the axial direction of the first reference area 3021. For example, the plurality of first notches 307 and the plurality of second notches 308 are staggered on the two sides of the first reference area 3021.

In some embodiments, the notch length of the first notch 307 and the notch length of the second notch 308 need to be determined based on a frequency range of transmitted signals. In this application, the notch length needs to meet the following formula:

$$L < \frac{\lambda}{8};$$

where L is the notch length, and λ is wavelength corresponding to a maximum frequency.

It should be noted that the notch length needs to meet the foregoing formula, that is, the impact of characteristic impedance change caused by the notches on signals transmitted over the first signal transmission line 303 and the second signal transmission line 304 may be ignored, so as to guarantee the signal transmission quality. It should be noted that a smaller notch length indicates less impact on transmission of differential mode signals, and a lower amplitude of impedance compensation. Therefore, the notch length needs to be reasonably selected based on an actual situation.

Figure 12:
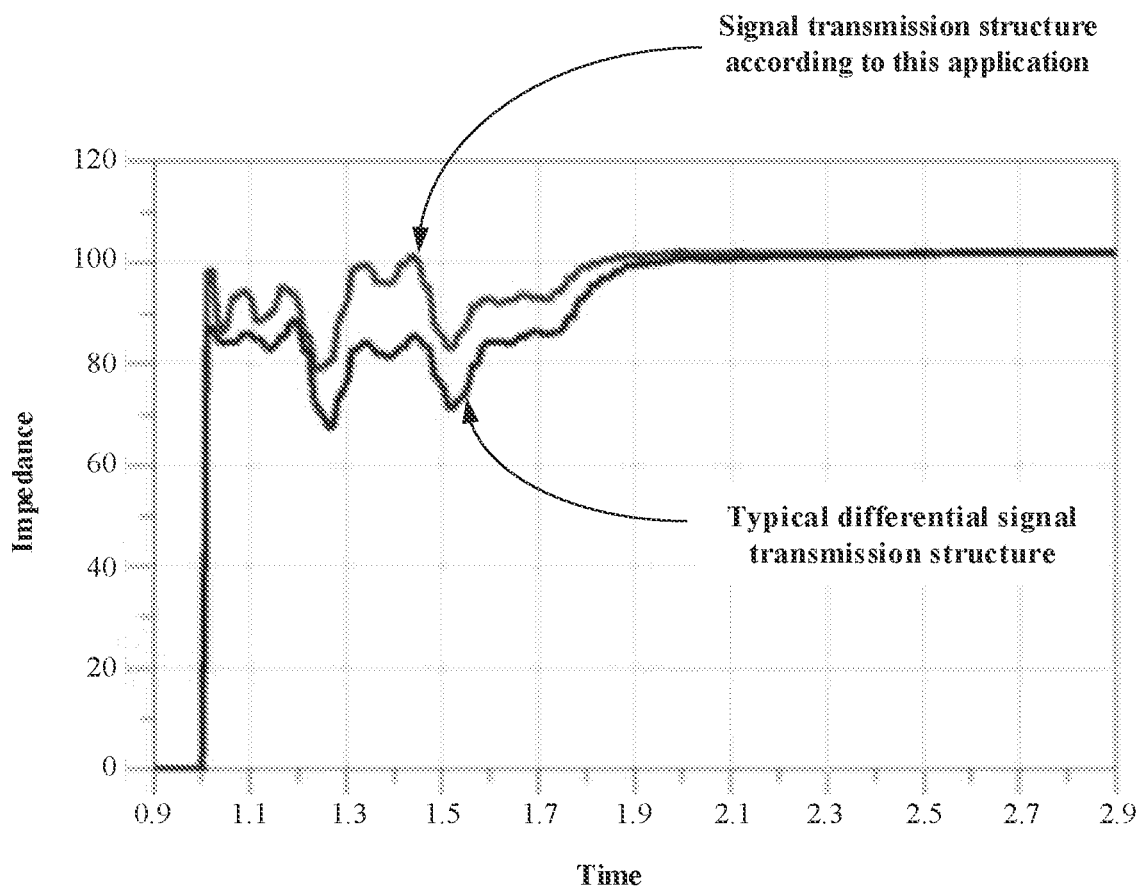
FIG. 12 is a diagram showing an example of a simulation comparison between a signal transmission structure according to an embodiment of this application and a typical differential signal transmission structure.

FIG. 12 is a diagram showing an example of a simulation comparison between a signal transmission structure according to an embodiment of this application and a typical differential signal transmission structure. As shown in FIG. 12, a differential characteristic impedance value of the signal transmission structure provided in this application is increased by about 10-15 ohms compared with that of the typical differential signal transmission structure, and the goal of controlling differential pair impedance to be at 90 ohms during transmission of high speed and high frequency signals is also achieved.

Figure 13:
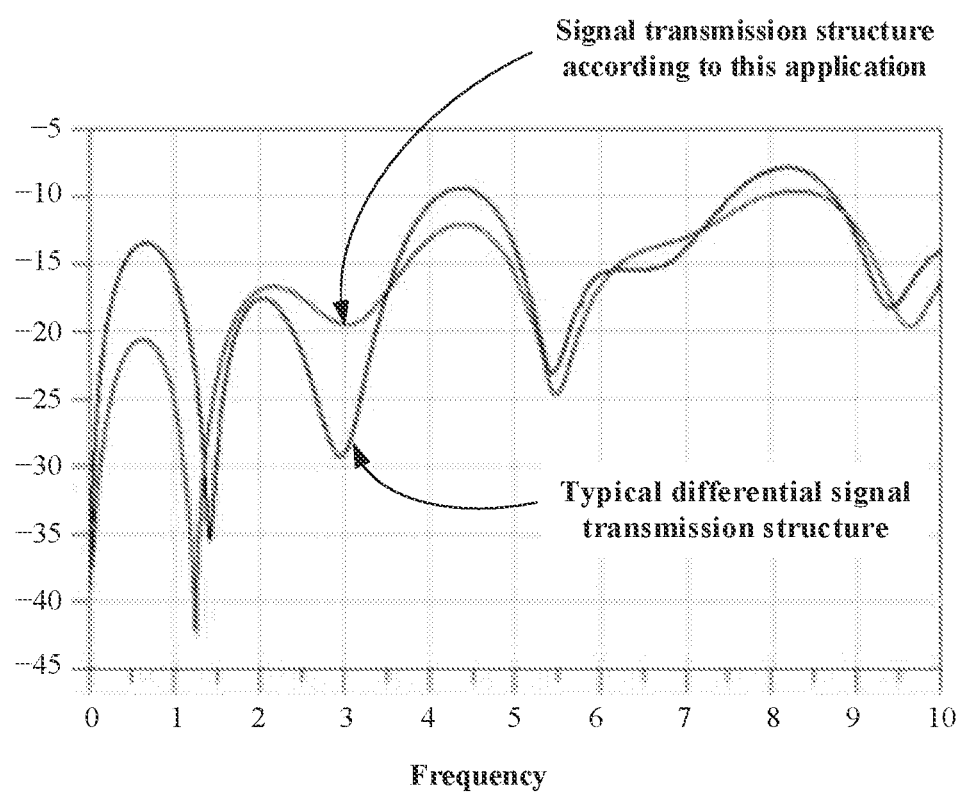
FIG. 13 is a diagram showing an example of a return loss comparison between a signal transmission structure according to an embodiment of this application and a typical differential signal transmission structure.
Figure 14:
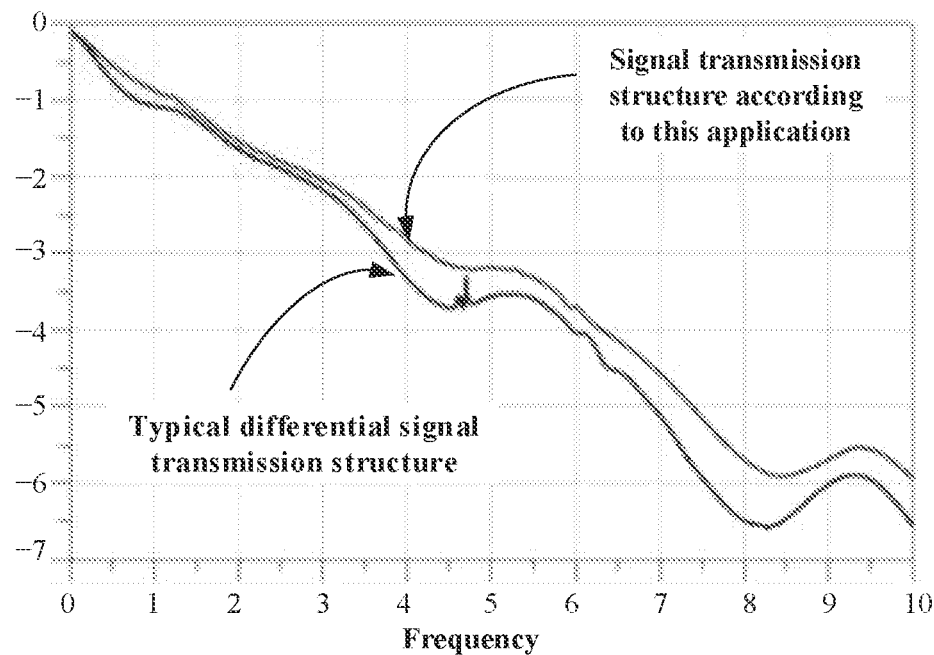
FIG. 14 is a diagram showing an insertion loss comparison between a signal transmission structure according to an embodiment of this application and a typical differential signal transmission structure.

FIG. 13 is a diagram showing an example of a return loss comparison between a signal transmission structure according to an embodiment of this application and a typical differential signal transmission structure. As shown in FIG. 13, compared with the return loss of the typical differential signal transmission structure, the return loss of the whole link of the signal transmission structure provided in this application is reduced. FIG. 14 is a diagram showing an insertion loss comparison between a signal transmission structure according to an embodiment of this application and a typical differential signal transmission structure. As shown in FIG. 14, compared with the insertion loss of the typical differential signal transmission structure, the insertion loss of the whole link of the signal transmission structure provided in this application is increased and significantly optimized. For example, the insertion loss is increased by about 0.5 dB at 4.2 GHz and 8.3 GHz.

In some embodiments, for an ideal lossless transmission line, the characteristic impedance is calculated by using the following formula:

$$Z = \sqrt{\frac{L}{C}};$$

where C is the capacitance per unit length, and L is the inductance per unit length.

Further, the capacitance per unit length C is calculated by using the following formula:

$$C = \frac{\varepsilon * A}{4\pi k * h};$$

where ε is dielectric constant, A is the area directly opposite the signal and the reference plane per unit length, h is the distance between the signal and the reference plane, and h is limited by the PCB laminated structure.

As system architectures become more and more complex, and the signal rate becomes higher and higher in addition to the appearance requirements of electronic devices, the transmission performance of high speed signals and the thickness of signal transmission structures become more important. The signal transmission structure provided in this application does not need to be provided with a multi-layer structure, a hollowed-out area is not required at an adjacent reference layer, and only grooves and notches are required at the reference layer corresponding to the signal transmission lines, so as to meet the requirements of board thickness and form an ultra-thin signal transmission structure. With the grooves and notches disposed at the reference layer, the edge coupling area per unit length and the capacitance per unit length are reduced, thereby increasing the characteristic impedance. In this application, the transmission structure is designed to reduce a coupling area per unit length to improve characteristic impedance, so as to implement optimal impedance control. The signal transmission structure has the advantages of low material costs and high space utilization.

Figure 15:
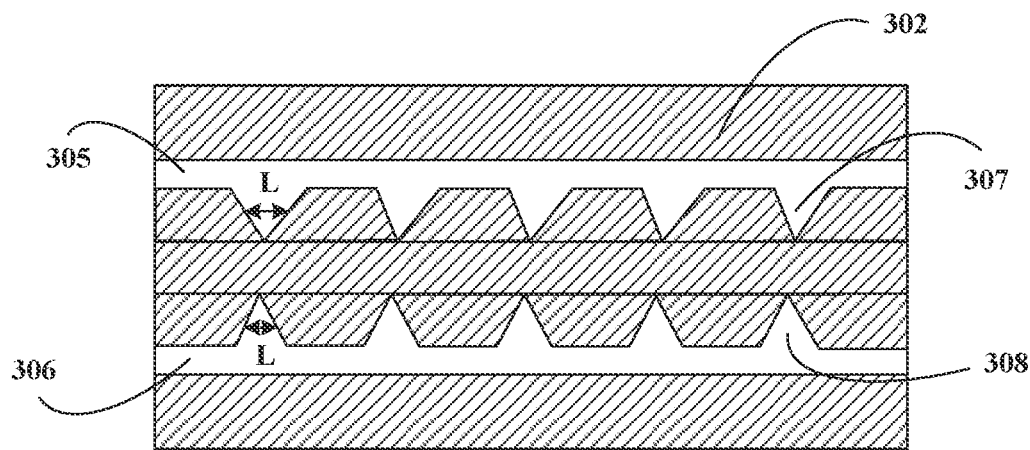
FIG. 15 is a schematic diagram of an example of a second signal transmission structure according to an embodiment of this application.

FIG. 15 is a schematic diagram of an example of a second signal transmission structure according to an embodiment of this application. Referring to FIG. 15, the reference ground layer 302 includes a first spacing groove 305 and a second spacing groove 306, and the first spacing groove 305 and the second spacing groove 306 are located on the two sides of the first reference area 3021. A plurality of first notches 307 and a plurality of second notches 308 are symmetrically disposed in the first reference area 3021 along an axial direction of the first reference area 3021. Each notch has a triangular structure, and a base of the triangle is disposed close to the first spacing groove 305 and the second spacing groove 306. The notch length L is a midpoint connecting line of two hypotenuses of the triangle, and a requirement for the notch length is the same as that for the rectangular notch in the first embodiment.

Figure 16:
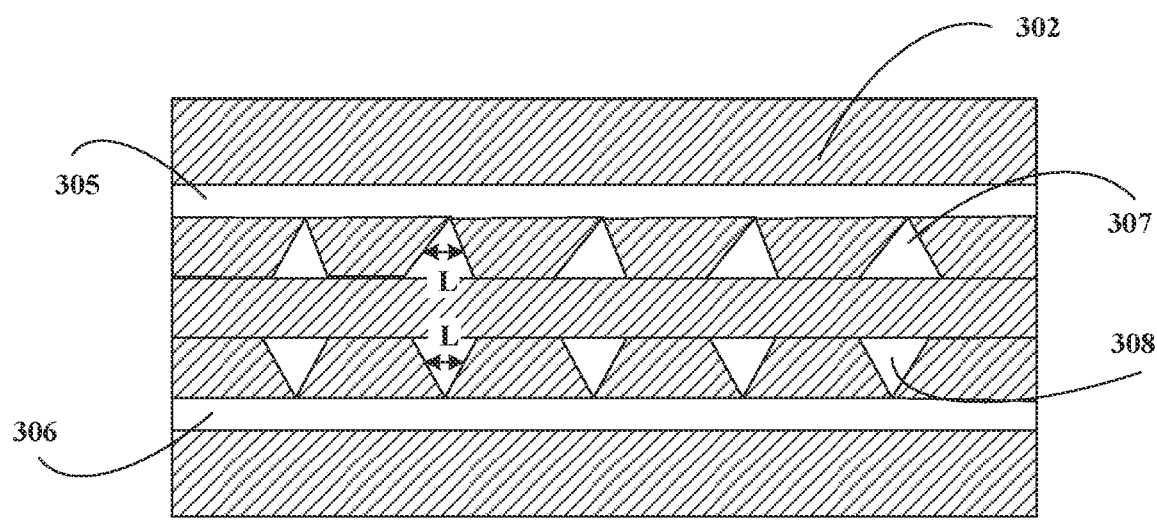
FIG. 16 is a schematic diagram of an example of a third signal transmission structure according to an embodiment of this application.

FIG. 16 is a schematic diagram of an example of a third signal transmission structure according to an embodiment of this application. Referring to FIG. 16, a plurality of first notches 307 and a plurality of second notches 308 are symmetrically disposed in the first reference area 3021 along an axial direction of the first reference area 3021. Each notch has a triangular structure, and a base of the triangle is disposed close to an axis of the first reference area 3021. Other structural settings are the same as those of the second transmission structure, and details are not described herein again.

Figure 17:
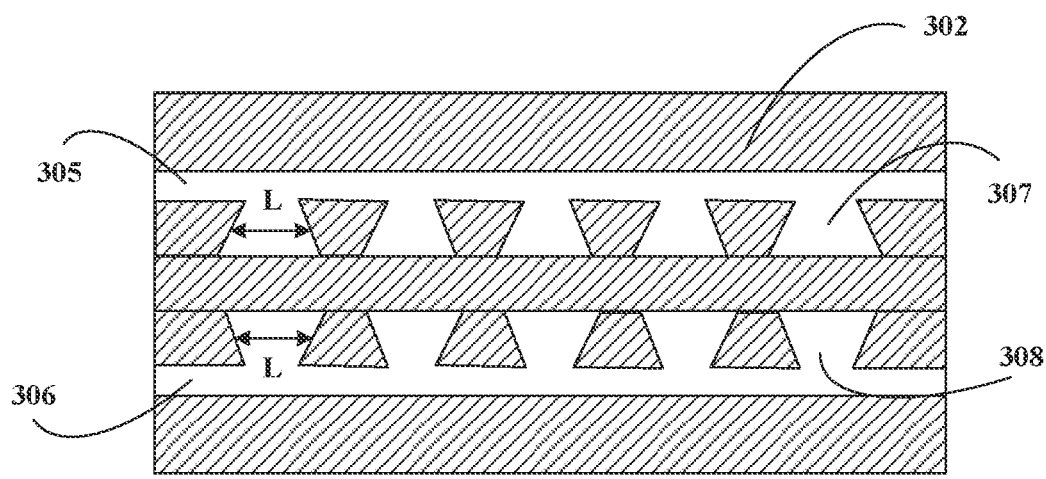
FIG. 17 is a schematic diagram of an example of a fourth signal transmission structure according to an embodiment of this application.

FIG. 17 is a schematic diagram of an example of a fourth signal transmission structure according to an embodiment of this application. Referring to FIG. 17, the reference ground layer 302 includes a first spacing groove 305 and a second spacing groove 306, and the first spacing groove 305 and the second spacing groove 306 are located on the two sides of the first reference area 3021. A plurality of first notches 307 and a plurality of second notches 308 are symmetrically disposed in the first reference area 3021 along an axial direction of the first reference area 3021. Each notch has a trapezoidal structure, and an upper base of the trapezoid is disposed close to the first spacing groove 305 and the second spacing groove 306, and a lower base of the trapezoid is disposed close to an axis of the first reference area 3021. The notch length is a midpoint connecting line of two lateral sides of the trapezoid, and a requirement for the notch length is the same as that for the rectangular notch in the first embodiment.

Figure 18:
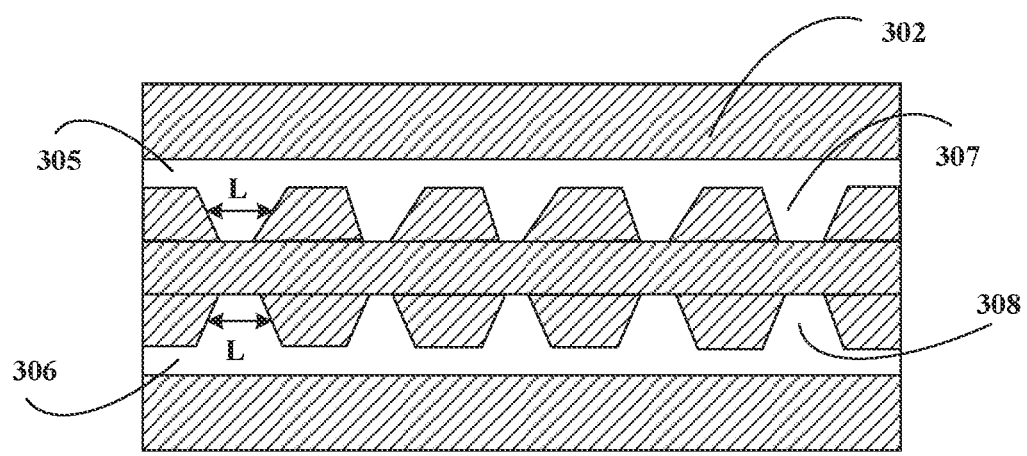
FIG. 18 is a schematic diagram of an example of a fifth signal transmission structure according to an embodiment of this application.

Further, FIG. 18 is a schematic diagram of an example of a fifth signal transmission structure according to an embodiment of this application. Referring to FIG. 18, a plurality of first notches 307 and a plurality of second notches 308 are symmetrically disposed in the first reference area 3021 along an axial direction of the first reference area 3021. Each notch has a trapezoidal structure, and an upper base of the trapezoid is disposed close to an axis of the first reference area 3021, and a lower base of the trapezoid is disposed close to the first spacing groove 305 and the second spacing groove 306. Other structural settings are the same as those of the fourth signal transmission structure, and details are not described herein again.

In some embodiments, a shape of the notch includes, but is not limited to, the foregoing shape, and may be any shape such as a polygon. The shapes of the first notch 307 and the second notch 308 may be different. For example, the first notch 307 may be a triangle, and the second notch 308 may be a rectangle. It should be noted that the shapes of the first notch 307 and the second notch 308 are not limited, but notch areas corresponding to the notches need to be consistent. If the notch areas are inconsistent, common mode interference will occur, and signal transmission will be affected.

The foregoing embodiment is described by using only one pair of differential signal transmission lines as an example. The signal transmission structure provided in this application may have a plurality of pairs of differential signal transmission lines. When there are a plurality of pairs of differential signal transmission lines, the structure of the corresponding reference ground layer is the same as that of the reference ground layer 302. Details are not described herein again. In this application, there may also be a plurality of signal transmission lines, the signal transmission lines are not paired differential signal transmission lines, but a plurality of independent single signal transmission lines. When there are independent single signal transmission lines, the width of the single signal transmission lines needs to meet the width of the foregoing differential signal transmission lines and gaps thereof, and the corresponding width at the reference ground layer is the width of the first reference area 3021. The structure at the reference ground layer corresponding to the single signal transmission lines is the same as that of the reference ground layer 302.

In some embodiments, an embodiment of this application further provides an electronic device. The electronic device includes a signal transmission structure, and the signal transmission structure is disposed inside the electronic device. During communication of the electronic device, the internal signal transmission structure reduces a coupling area per unit length to increase characteristic impedance, by providing notches and spacing grooves at the reference ground layer, so as to implement optimal impedance control. The signal transmission structure has the advantages of low material costs and high space utilization.

In some embodiments, an embodiment of this application further provides a PCB, where the PCB includes a signal transmission structure, and the signal transmission structure is disposed inside the PCB. The signal transmission structure may be used in an ultra-thin single-layer PCB structure, and may also be used in a laminated structure of a multi-layer PCB structure. Specific usage scenarios of the signal transmission structure are not limited, and the signal transmission structure may or may not be disposed at a buried layer.

A person skilled in the art may easily think of other embodiments of this application after considering the specification and practicing the application disclosed herein. This application is intended to cover any variations, uses, or adaptations of this application. These variations, uses, or adaptations follow the general principles of this application and include common knowledge or conventional technical means in the art that are not disclosed in this application. The specification and the embodiments are considered as examples, and the true scope and spirit of this application are indicated by the following claims.

It should be understood that this application is not limited to the precise structures described above and shown in the accompanying drawings, and various modifications and changes may be made without departing from the scope thereof. The scope of this application is limited only by the appended claims.

What is claimed is:

1. A signal transmission structure, comprising:
a reference ground layer; and
a signal layer disposed above the reference ground layer; wherein the signal layer comprises a plurality of signal transmission lines disposed in parallel along a line width direction having gaps therebetween,
wherein the reference ground layer comprises a first reference area, and the first reference area is an orthographic projection area, at the reference ground layer, of two of the plurality of signal transmission lines and a gap between two of the signal transmission lines,
wherein the first reference area is provided with a plurality of notches, and the plurality of notches is located on an orthographic projection, in the first reference area, of the two signal transmission lines, and the notches are distributed in an array at intervals along a line length direction of the signal transmission lines,
wherein spacing grooves are disposed on two sides of the first reference area, and the spacing grooves are continuously distributed along the line length direction of the signal transmission lines, and
wherein the orthographic projection, in the first reference area, of the two signal transmission lines comprises a first orthographic projection, in the first reference area, of one of the signal transmission lines, and a second orthographic projection, in the first reference area, of another one of the signal transmission lines, wherein a first portion of the plurality of notches in the first orthographic projection and a second portion of the plurality of notches in the second orthographic projection are either symmetrically disposed or staggered along an axial direction of the first reference area.

2. The signal transmission structure of claim 1, wherein the reference ground layer further comprises two second reference areas, and the two second reference areas are distributed on the two sides of the first reference area along the line width direction of the signal transmission lines, and wherein a spacing groove is located between each of the second reference areas and the first reference area.

3. The signal transmission structure of claim 1, wherein a width of each notch in a line width direction of the signal transmission lines is equal to a width of the signal transmission lines.

4. The signal transmission structure of claim 1, wherein a length of the notches is the same in the line length direction of the signal transmission lines.

5. The signal transmission structure of claim 4, wherein the length of the notches in the line length direction of the signal transmission lines satisfies the following formula:

$$L < \frac{\lambda}{8},$$

wherein L is the length of the notches in the line length direction of the signal transmission lines, and λ is a wavelength corresponding to a maximum frequency of a signal.

6. The signal transmission structure of claim 1, wherein the notches are rectangular notches.

7. The signal transmission structure of claim 1, wherein the notches are triangular notches.

8. The signal transmission structure of claim 1, wherein the notches are trapezoidal notches.

9. The signal transmission structure of claim 1, wherein a width of the spacing grooves is the same.

10. The signal transmission of to claim 1, further comprising a dielectric layer disposed between the signal layer and the reference ground layer.

11. An electronic device, comprising:
a signal transmission structure, comprising:
a reference ground layer; and
a signal layer disposed above the reference ground layer; wherein the signal layer comprises a plurality of signal transmission lines disposed in parallel along a line width direction having gaps therebetween,
wherein the reference ground layer comprises a first reference area, and the first reference area is an orthographic projection area, at the reference ground layer, of two of the plurality of signal transmission lines and a gap between two of the signal transmission lines,
wherein the first reference area is provided with a plurality of notches, and the plurality of notches is located on an orthographic projection, in the first reference area, of the two signal transmission lines, and the notches are distributed in an array at intervals along a line length direction of the signal transmission lines,
wherein spacing grooves are disposed on two sides of the first reference area, and the spacing grooves are continuously distributed along the line length direction of the signal transmission lines,
wherein the orthographic projection, in the first reference area, of the two signal transmission lines comprises a first orthographic projection, in the first reference area, of one of the signal transmission lines, and a second orthographic projection, in the first reference area, of another one of the signal transmission lines, wherein a first portion of the plurality of notches in the first orthographic projection and a second portion of the plurality of notches in the second orthographic projection are either symmetrically disposed or staggered along an axial direction of the first reference area, and
wherein the signal transmission structure is disposed inside the electronic device.

12. The electronic device of claim 11, wherein the reference ground layer further comprises two second reference areas, and the two second reference areas are distributed on the two sides of the first reference area along the line width direction of the signal transmission lines, and wherein a spacing groove is located between each of the second reference areas and the first reference area.

13. The electronic device of claim 11, wherein a width of each notch in a line width direction of the signal transmission lines is equal to a width of the signal transmission lines.

14. The electronic device of claim 11, wherein a length of the notches is the same in the line length direction of the signal transmission lines.

15. The electronic device of claim 14 wherein the length of the notches in the line length direction of the signal transmission lines satisfies the following formula:

$$L < \frac{\lambda}{8},$$

wherein L is the length of the notches in the line length direction of the signal transmission lines, and λ is a wavelength corresponding to a maximum frequency of a signal.

16. The electronic device of claim 11, wherein a width of the spacing grooves is the same.

17. The electronic device of claim 11, further comprising a dielectric layer disposed between the signal layer and the reference ground layer.

18. A printed circuit board (PCB), comprising:
a signal transmission structure, comprising:
a reference ground layer; and
a signal layer disposed above the reference ground layer; wherein the signal layer comprises a plurality of signal transmission lines disposed in parallel along a line width direction having gaps therebetween,
wherein the reference ground layer comprises a first reference area, and the first reference area is an orthographic projection area, at the reference ground layer, of two of the plurality of signal transmission lines and a gap between two of the signal transmission lines,
wherein the first reference area is provided with a plurality of notches, and the plurality of notches is located on an orthographic projection, in the first reference area, of the two signal transmission lines, and the notches are distributed in an array at intervals along a line length direction of the signal transmission lines,
wherein spacing grooves are disposed on two sides of the first reference area, and the spacing grooves are continuously distributed along the line length direction of the signal transmission lines,
wherein the orthographic projection, in the first reference area, of the two signal transmission lines comprises a first orthographic projection, in the first reference area, of one of the signal transmission lines, and a second orthographic projection, in the first reference area, of another one of the signal transmission lines, wherein a first portion of the plurality of notches in the first orthographic projection and a second portion of the plurality of notches in the second orthographic projection are either symmetrically disposed or staggered along an axial direction of the first reference area, and
wherein the signal transmission structure is disposed inside the PCB.

19. The PCB of claim 18, wherein a width of each notch in a line width direction of the signal transmission lines is equal to a width of the signal transmission lines.

20. The PCB of claim 18, wherein a length of the notches is the same in the line length direction of the signal transmission lines.

* * * * *